United States Patent [19]

Shigeta

[11] Patent Number: 5,328,537
[45] Date of Patent: Jul. 12, 1994

[54] METHOD FOR MANUFACTURING SCREEN PRINTING PLATE

[75] Inventor: Tatsuo Shigeta, Chiba, Japan

[73] Assignee: Think Laboratory Co., Ltd., Chiba, Japan

[21] Appl. No.: 869,543

[22] Filed: Apr. 15, 1992

[30] Foreign Application Priority Data

Dec. 11, 1991 [JP] Japan .................................. 3-351600
Dec. 20, 1991 [JP] Japan .................................. 3-355811

[51] Int. Cl.$^5$ .......................... B32B 31/00; G03F 7/12
[52] U.S. Cl. .................................. 156/233; 156/272.8;
156/344; 156/249; 156/289; 205/143; 205/112;
205/127; 205/223; 205/918; 430/308
[58] Field of Search ................ 430/308, 296; 156/344,
156/642, 247, 272.8, 150, 151, 230, 233, 237,
241, 249, 289; 205/166, 143, 151, 112, 127, 223,
221, 918

[56] References Cited

U.S. PATENT DOCUMENTS

| 3,610,143 | 10/1971 | Greenwood | 430/308 |
| 3,696,742 | 10/1972 | Parts et al. | 430/308 |
| 4,118,288 | 10/1978 | Ruckl | 204/11 |
| 4,398,462 | 8/1983 | Okano et al. | 101/128.21 |
| 4,750,962 | 6/1988 | Haygood et al. | 156/344 |
| 4,946,763 | 8/1990 | Snakenborg | 430/308 |
| 5,122,442 | 6/1992 | Moskowitz et al. | 430/308 |

Primary Examiner—David A. Simmons
Assistant Examiner—Chester T. Barry
Attorney, Agent, or Firm—Koda and Androlia

[57] ABSTRACT

A method of manufacturing a screen printing plate which can be obtained without using a mother mesh sheet and a resist film including a step of providing a non-plating area on the roll and exposing the roll coated with high-sensitivity photosensitive film by a multiple number of laser beams. The multiple number of laser beams are controlled by preset electric data so that the desired halftone points of negative halftone image are exposed on the roll.

5 Claims, 4 Drawing Sheets

METHOD FOR MANUFACTURING SCREEN PRINTING PLATE

BACKGROUND OF THE INVENTION

1. Field of the Invention

The present invention relates to a method for manufacturing a screen printing plate in which the screen printing plate is obtained by performing a plating process.

2. Prior Art

Recently, in a manufacturing screen printing plate, it is desirable to directly expose a photosensitive film by laser beams which are controlled by information supplied from a computer for a design and stored in memory modules thereof to make any design of screen printing plates.

However, in a conventional method for making a screen printing plate, a screen printing plate is obtained by coating a photosensitive film on a mother mesh sheet made of a rosin or iron that is plated by nickel, and placing a resist film prepared on the basis of information supplied from a computer over the mother mesh sheet, and exposing and developing the mother mesh sheet. After the developing, the mother mesh sheet is plated by metal, for example, nickel. Thus, the screen printing plate is obtained. Therefore, there is no progress in a making a screen printing plate though a technology of a video data processing has been progressed. In other words, although the technology of the video data processing, for example, to make a picture data by computers and a technology of a laser processing have been progressed in recent years, the making process of the screen printing plate as was before is performed.

SUMMARY OF THE INVENTION

The object of the present invention is to provide a method for manufacturing screen printing plate in which the screen printing plate can be obtained without the mother mesh sheets and the resist films, and it is easy to make a duplicate of the screen printing plate by plating a roll that is to be made into printing plate. Therefore, a manufacturing cost of the screen printing plate is low, and few processes are required to make the screen printing plate.

SUMMARY OF THE INVENTION

In order to achieve the object, the present invention provides a method of manufacturing screen printing plate in which (a) a first non-plating areas are provided on a roll at both ends so as to prevent forming a nickel plate, and a second non-plating area, which extends in the direction of the lengthwise, is provided on a part of a surface of the roll, (b) a tape made of a metal is fastened on the roll so that it overlaps the second non-plating area, and the roll is coated with a photosensitive film, (c) the roll is supported at both ends and rotated in predetermined speed, (d) a multiple number of laser beams arranged in a prescribed manner are caused to scan the length of the roll surface while the laser beams are intermittently actuated on the basis of electronic data representing desired halftone image, so that halftone points of the negative halftone image are subjected to a laser exposure by the laser beams, and the halftone points are provided apart from the non-plating areas on the roll, (e) a negative halftone image in which the halftone points remain is formed by subsequent development, (f) the other areas surrounding the halftone points and the negative halftone image are filled with nickel by a nickel plating process, and (g) the screen printing plate, which consist of the halftone image portion and a leaf portion, is peeled off from the roll.

DETAILED DESCRIPTION OF THE INVENTION

An embodiment of the method of the present invention for manufacturing screen printing plate will be described with reference to FIGS. 1 through 6.

Figure 1:
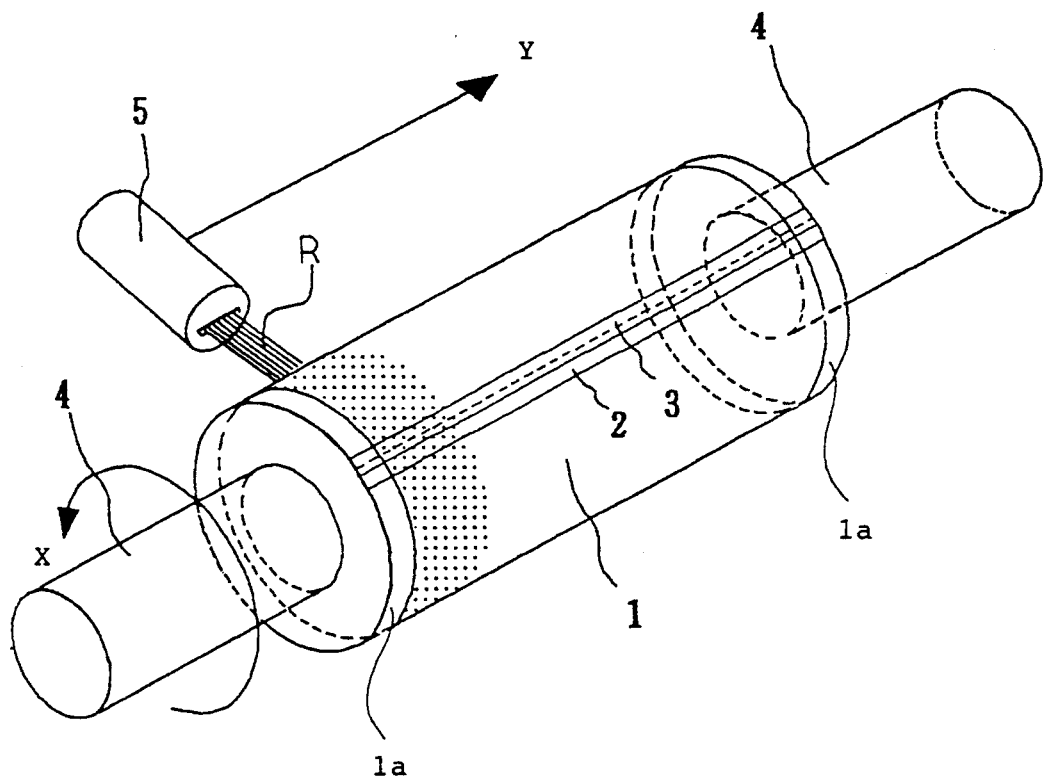
FIG. 1 is a perspective view which illustrates the laser exposure process of the present invention.

As shown in FIG. 1, a roll 1 is made of iron which is plated by copper or nickel, or made of aluminum or stainless steel. First non-plating areas 1a where a resin is coated on the roll 1 to prevent forming a plating are provided on the both ends including a circumferential surface of the roll 1.

An oxide film or an organic film is provided on the other area of the roll 1 so that the roll 1 has surface properties in which a plated metal can easily be peeled off from the roll 1. In case of that the roll 1 is made of stainless steel, providing the oxide film or the organic film is not necessary since stainless steel has a surface property such that a plated metal can easily be peeled off.

A second non-plating area 2 is provided on the roll 1 along the lengthwise of the roll 1 where an adhesive tape is fastened or a coating material is applied in predetermined width to prevent forming a plating, and a tape 3 made of metallic is fastened on the roll 1 so that the metallic tape is laid over the edge of the second non-plating area 2. The metallic tape 3 is allow to electrodeposit a nickel plating on its surface.

A high-sensitivity photosensitive agent (polymer), which reacts to an argon ion laser with a wavelength of 488 nanometers, is coated on the roll 1 so that the photosensitive agent is formed with a uniform thickness.

After the photosensitive agent is dried, a transparent protective film, for example, polyvinyl alcohol, is coated on the photosensitive agent so as to prevent the photosensitive film from being oxidized since the photosensitive film tends to be easily oxidized and the photosensitive film loses its photosensitivity when the photosensitive film is oxidized.

Next, the roll 1 is held at both ends by chucks 4 installed on a laser exposure apparatus, and the roll 1 is rotated in the direction indicated by arrow X. Afterward, a plurality of argon ion laser beams R with a wavelength of 488 nanometers, that are arranged in a straight chain arrangement, are emitted from a laser head 5 of the laser exposure apparatus to the surface of the roll 1, and the laser head 5 is scanned in the direction indicated by arrow Y. An emission of the argon ion laser beams R is controlled by electronic data for making a desired halftone image, and the electronic data is stored in memory modules of a computer and supplied therefrom.

Figure 2:
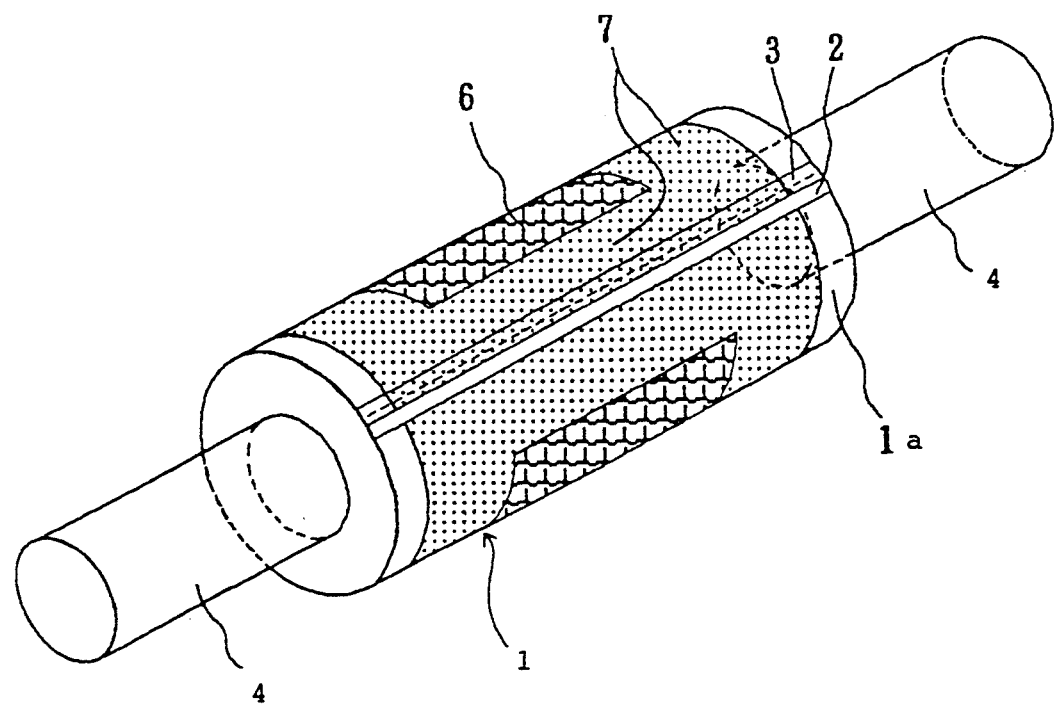
FIG. 2 is a perspective view which illustrates the nickel plating process.

As shown in FIG. 2, the halftone image 6 is exposed by the laser beams R and provided apart from the first and second non-plating area and the metallic tape 3. The other area 7 surrounding the halftone image 6 is not entirely exposed by the laser beams R.

Figure 3A:
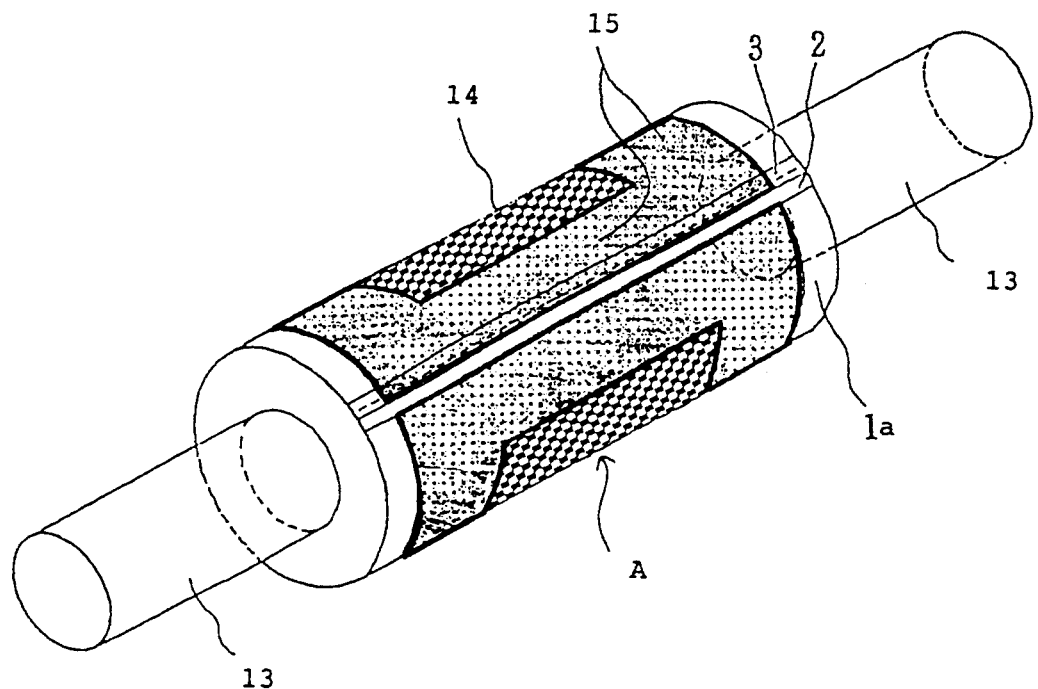
FIG. 3(a) is a perspective view which illustrates the developing process.

Next, as shown in FIG. 3(a) the roll 1 is removed from the chuck 4 and held by chuck 13 of a developing apparatus (not shown). Afterwards, the roll 1 is immersed in a developing liquid (not shown) and rotated at predetermined speed. As a result, the positive halftone image in which exposed portion are remained is developed.

After the developing, the developed roll 1 is immersed in a nickel plating liquid (not shown) and rotated at predetermined speed, and an electric current is applied to the roll so that nickel plating is formed on the roll 1 with a thickness of 0.01 to 0.025 mm.

As a result of the plating process, a screen printing plate A which is comprised of a negative halftone image 14 and a foil section 15 is obtained. The negative halftone image 14 made of nickel is formed on the roll surface corresponded to the halftone image area 6, and the foil section 15 made of nickel is also formed on the roll surface corresponded to the other area 7 surrounding the halftone image area 6.

Figure 3B:
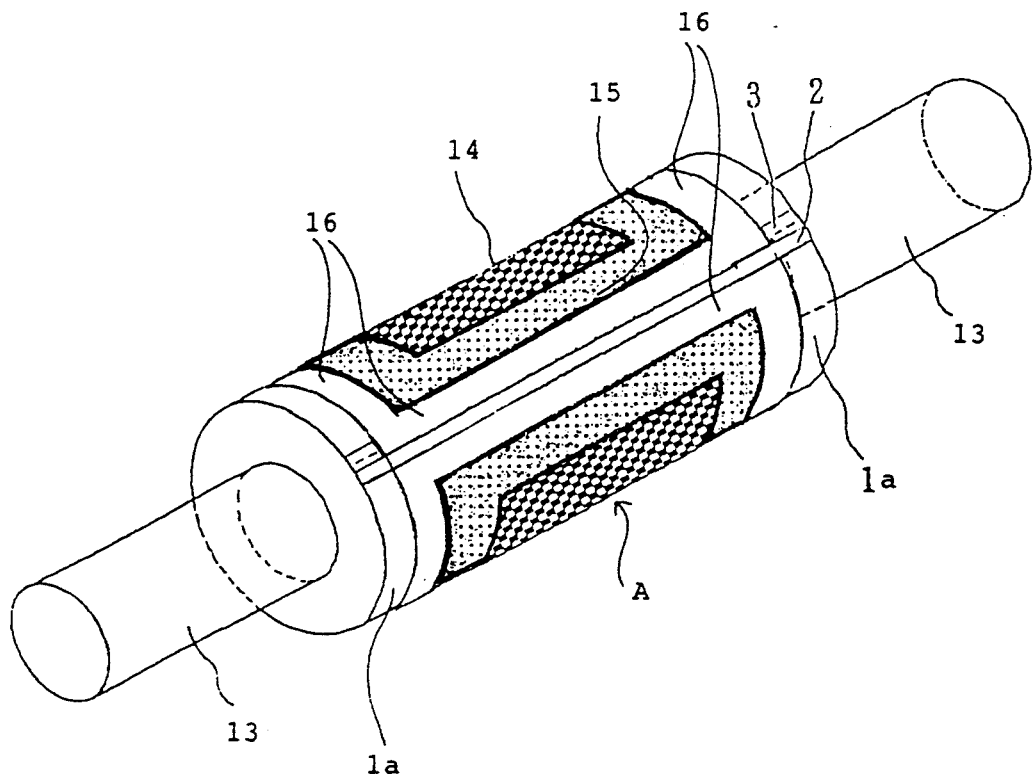
FIG. 3(b) is a perspective view which illustrates the adhesive material applying process.

Next, as shown in FIG. 3(b), adhesive material, for example, double-coated adhesive tapes 16 are fastened on the foil section 15 such that the double-coated adhesive tapes 16 are overlapped on the foil section 15 and the edge of the double-coated adhesive tapes 16 are along with the edge of the foil section 15. Afterwards, the screen printing plate A is peeled off from the roll 1 by tearing up the metallic tape 3. Thus, the rolled screen printing plate is unrolled as a flat sheet.

Next, as shown in FIG. 3(a), the screen printing plate A is placed on a frame apparatus 8. The frame apparatus 8 is comprised of frame members 8a, 8b, and 8c, clamps 9, and actuators 10 and 11.

The frame member 8c is U-shaped, and the actuator 10 and 11 are provided thereon. The frame member 8b is provided inside of the frame member 8c and connected to the shaft of the actuator 11 so that the frame member 8b can be moved in parallel with one side of the frame member 8c when the actuator 11 is operated.

The frame member 8a is connected to the shaft of the actuator 10 and can De moved so that a space between the frame member 8a and 8c is adjusted by operating the actuator 10.

Figure 5A:
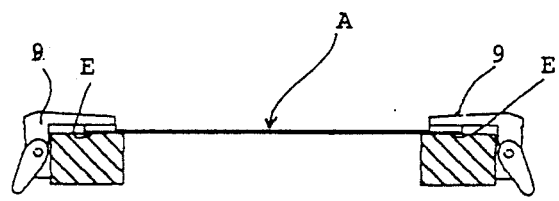
FIGS. 5(a) through 5(c) and 6(a) through 6(d) are side views illustrating the screen printing plate mounting process of the present invention.

The screen printing plate A is fastened on the frame member 8a, 8b, and 8c by the double-coated adhesive tapes 16, and the edges of the screen printing plate are held down by the clamp 9. Afterwards, the shafts of the actuator 10 are extended and the shaft of the actuator 11 is contracted so that the screen printing plate A is stretched out as shown in FIG. 5(a).

Next, a printing frame 12 on which an adhesive agent, for example, epoxy resins, is applied is moved up so that the upper surface of the printing frame 12 is stuck to the under surface of the screen printing plate A.

Figure 5B:
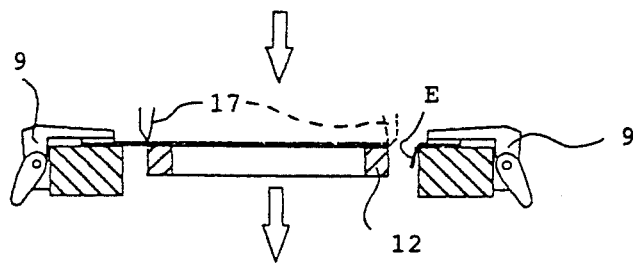
Figure 5C:
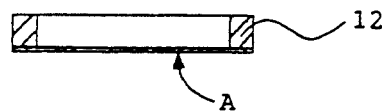

After the adhesive agent is dried and the screen printing plate A is adhered to the printing frame 12, a portion E of the foil section 15 where the foil section 15 is exceeded from the outer edge of the printing frame 12 is cut off by a cutting member 17 as shown in FIG. 5(b), and the screen printing plate A is thus obtained as shown in FIG. 5(c).

Afterwards, the printing frame 12 with the screen printing plate A is installed to a screen printing machine (not shown), and a screen printing is performed.

In case it is difficult to place the screen printing plate A on the frame apparatus 8 in stretched condition, following process easily makes it possible to place the screen printing plate A on the frame apparatus 8 in stretched condition.

Figure 4:
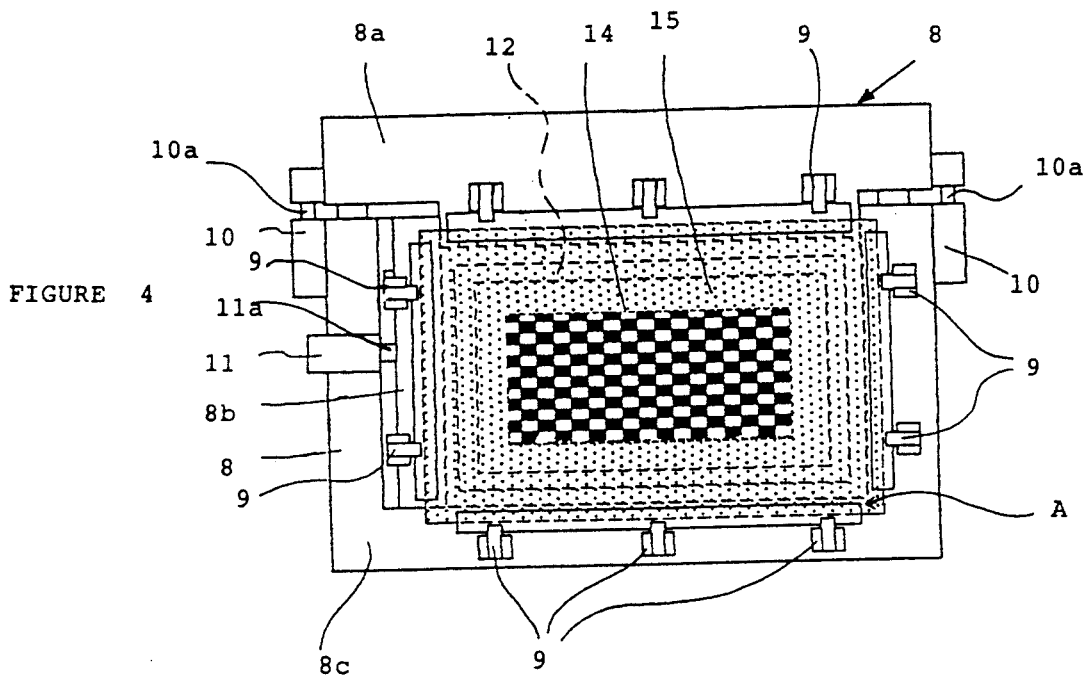
FIG. 4 is a front view which illustrates the screen printing plate mounting process.
Figure 6A:
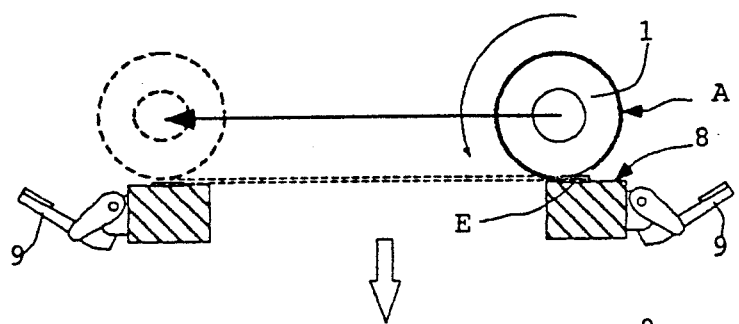

After the double-coated adhesive tape 16 are fastened on the foil section 15 as shown in FIG. 3(b), the roll 1 is placed on the frame apparatus 8 without peeling off the screen printing plate A from the roll 1 as shown in FIGS. 4 and 6(a).

Afterward, the roll 1 is rolled on the frame apparatus 8 so that the surface of the screen printing plate A is comes into contact with the upper surface of the frame member 8a through 8c of the frame member 8, and the screen printing plate A is fastened on the frame apparatus 8 by the double-coated adhesive tape 16.

As a result, the printing plate A is unrolled as a flat sheet and placed on the frame member 8 in the stretched condition.

Figure 6B:
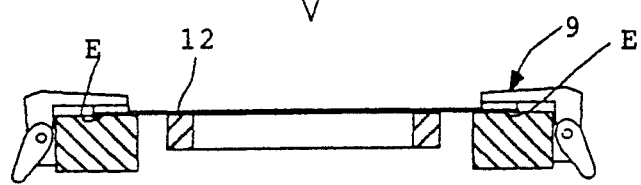

Next, as shown in FIGS. 5(a) and 6(b), the edges of the screen printing plate A are held by the clamp 9, and the shaft of the actuator 10 are extended and the shaft of the actuator 11 is contracted so that the screen printing plate A is more stretched out.

Next, a printing frame 12 on which an adhesive agent, for example, epoxy resins, is applied is moved up so that the upper surface of the printing frame 12 is stuck to the under surface of the screen printing plate A.

Figure 6C:
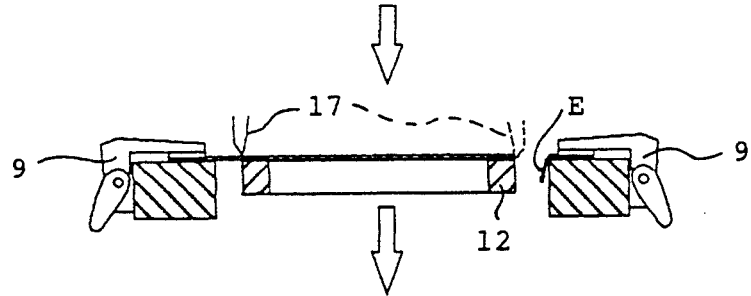
Figure 6D:
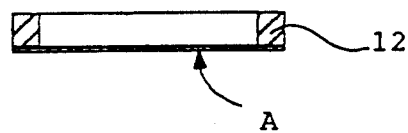

As shown in FIGS. 5(b) and 6(c), after the adhesive agent is dried and the screen printing plate A is adhered to the printing frame 12, a portion E of the foil section 15 where the foil section 15 is exceeded from the outer edge of the printing frame 12 is cut off by the cutting member 17, and the screen printing plate is thus obtained as shown in FIGS. 5(c) and 6(d).

Afterwards, the printing frame 12 with the screen printing plate A is installed to a screen printing machine (not shown), and a screen printing is performed.

As described above, since the screen printing plate A is provided on the frame apparatus by rolling the roll A, the screen printing plate A is easily fastened on the printing frame 12 in stretched condition.

An other adhesive material, for example, an adhesive agent can be used instead of the double-coated adhesive tape 16, and the adhesive material can also be provided on the frame member instead of providing the adhesive material on the roll for placing the screen printing plate.

A duplicate of the screen printing plate can easily be made by repeating the screen printing plate making steps after developing the roll 1 as described above.

Furthermore, nickel is used for making the screen printing plate, however, alloyed nickel, copper, alloyed copper, and chrome can be used as a plating material instead of nickel. In case that chrome is used for plating, a durability of the screen printing plate is improved compared to the screen printing plate comprised of nickel plating plate.

As described above, a screen printing plate can be obtained at low cost since the method of the present invention of manufacturing screen printing plate does not use a mother mesh sheet and a resist film. Furthermore, the roll in which the negative halftone image is formed can repeatedly be undergone a plating. Thus, the duplicate of the screen printing plate can easily be obtained without excess expenses.

What is claimed is:

1. A method for manufacturing screen printing plates comprising the steps of:

provided a first non-plating area at both ends of a roll and a second non-plating area at a surface of said roll along a lengthwise direction with a predetermined width;

fastening metal tape on the roll so that an edge of said metal tape is along an edge of said second non-plating area;

coating a photosensitive film on said roll;

supporting said roll at both ends and rotating said roll at a predetermined speed;

scanning a multiple number of laser beams arranged in a prescribed manner in the lengthwise direction of said roll while said laser beams are driven by electronic data which is preset so that desired halftone points of a negative halftone image are exposed on said roll apart from said first non-plating area and said metal tape;

developing said negative halftone image;

plating said roll bearing said developed image so that a screen printing plate comprised of said negative halftone image and a foil section is formed by a plating metal; and removing said screen printing plate made of said plating metal from said roll by tearing up said metal tape.

2. A method for providing screen printing plates on a frame comprising the steps of:

applying adhesive material on a surrounding edge of a roll on which a screen printing plate is formed, and said screen printing plate being easily peeled off from said roll;

rolling said roll with said screen printing plate on a frame apparatus and unrolling said screen printing plate as a flat sheet so that said screen printing plate is fastened on said frame apparatus by said adhesive material in a stretched condition;

sticking said screen printing plate on a printing frame on which an adhesive agent is applied; and cutting off an exceed portion where a foil section of said screen printing plate extends beyond the outer edge of said printing frame.

3. A method for providing screen printing plates on a frame comprising the steps of:

applying adhesive material on a surface of a frame apparatus;

rolling a roll on said frame apparatus, and a screen printing plate being formed on a circumference of said roll, and said screen printing plate being easily peeled off from said roll;

unrolling said screen printing plate as a flat sheet so that said screen printing plate is fastened on said frame apparatus by said adhesive material in a stretched condition;

sticking said screen printing plate on a printing frame on which an adhesive agent is applied; and cutting off an exceed portion where a foil section of said screen printing plate extends beyond an outer edge of said printing frame.

4. A method for manufacturing screen printing plate according to claim 1, further comprising the steps of:

applying adhesive material on a surrounding edge of said screen printing plate wherein said screen printing plate can easily be peeled off from said roll;

rolling said roll with said screen printing plate and unrolling said screen printing plate as a flat sheet onto a frame apparatus so that said screen printing plate is fastened on said frame apparatus by said adhesive material in a stretched condition;

sticking said screen printing plate on a printing frame on which an adhesive agent is applied; and cutting off an exceed portion where a foil section of said screen printing plate extends beyond an outer edge of said printing frame.

5. A method for manufacturing screen printing plate according to claim 1, further comprising the steps of:

applying adhesive material on a surface of a frame apparatus;

rolling said roll on said frame apparatus, with said screen printing plate formed on a circumference of said roll wherein said screen printing plate can easily be peeled off rom said roll;

unrolling said screen printing plate as a flat sheet so that said screen printing plate is fastened on said frame apparatus by said adhesive material in a stretched condition;

sticking said screen printing plate on a printing frame on which an adhesive agent is applied; and cutting off an exceed portion where a foil section of said screen printing plate extends beyond an outer edge of said printing frame.

* * * * *